(12) United States Patent
Hassan-Ali et al.

(10) Patent No.: US 10,008,797 B2
(45) Date of Patent: Jun. 26, 2018

(54) FLEXIBLE PRINTED CIRCUIT CONNECTOR AND CONNECTOR ASSEMBLY INCLUDING THE SAME

(71) Applicant: Tyco Electronics Corporation, Berwyn, PA (US)

(72) Inventors: Mudhafar Hassan-Ali, Menlo Park, CA (US); Jason Larson, San Lorenzo, CA (US)

(73) Assignee: TE Connectivity Corporation, Berwyn, PA (US)

( * ) Notice: Subject to any disclaimer, the term of this patent is extended or adjusted under 35 U.S.C. 154(b) by 122 days.

(21) Appl. No.: 14/796,470

(22) Filed: Jul. 10, 2015

(65) Prior Publication Data

US 2017/0012378 A1    Jan. 12, 2017

(51) Int. Cl.

| H05K 1/11 | (2006.01) |
| H01R 12/79 | (2011.01) |
| H05K 1/02 | (2006.01) |
| H05K 3/36 | (2006.01) |
| H05K 1/00 | (2006.01) |
| H01R 12/71 | (2011.01) |
| H05K 1/14 | (2006.01) |
| H01R 12/59 | (2011.01) |
| H05K 3/32 | (2006.01) |

(52) U.S. Cl.
CPC .......... H01R 12/79 (2013.01); H05K 1/0298 (2013.01); H05K 1/118 (2013.01); H05K 3/361 (2013.01); *H01R 12/59* (2013.01); *H01R 12/71* (2013.01); *H01R 12/712* (2013.01); *H01R 12/718* (2013.01); *H05K 1/14* (2013.01); *H05K 1/141* (2013.01); *H05K 1/142* (2013.01); *H05K 1/145* (2013.01); *H05K 1/147* (2013.01); *H05K 3/323* (2013.01); *H05K 2201/046* (2013.01); *H05K 2201/096* (2013.01); *H05K 2201/09036* (2013.01); *H05K 2201/09045* (2013.01)

(58) Field of Classification Search
CPC .......... H05K 1/14; H05K 1/141; H05K 1/142; H05K 1/145; H05K 1/147; H05K 2201/046; H01R 12/71; H01R 12/712; H01R 12/718; H01R 12/59
USPC .......................... 361/784, 786, 803; 439/67
See application file for complete search history.

(56) References Cited

U.S. PATENT DOCUMENTS

| 4,116,517 A * | 9/1978 | Selvin .................... H05K 3/365 |
| | | 29/846 |
| 4,503,611 A | 3/1985 | Sampson et al. |
| 5,525,065 A | 6/1996 | Sobhani |
| 5,583,321 A | 12/1996 | DiStefano et al. |

(Continued)

*Primary Examiner* — Binh Tran (57) ABSTRACT

Flexible printed circuit (FPC) connector includes a flex circuit having first and second side surfaces and a thickness extending between the first and second side surfaces. The flex circuit includes a plurality of stacked substrate layers. The FPC connector also includes a conductive pathway extending through the flex circuit and a substrate protrusion coupled to the second side surface and projecting a distance away from the second side surface. The substrate protrusion is formed from at least one dielectric layer. The FPC connector also includes a contact pad that is directly coupled to at least one of the substrate protrusion or the second side surface of the flex circuit. The contact pad is electrically coupled to the conductive pathway.

20 Claims, 5 Drawing Sheets

(56) References Cited

U.S. PATENT DOCUMENTS

| | | | | |
|---|---|---|---|---|
| 5,938,455 | A * | 8/1999 | Glovatsky | H01R 12/58 |
| | | | | 439/290 |
| 6,490,168 | B1 | 12/2002 | Rochowiez | |
| 6,723,928 | B1 | 4/2004 | Berg et al. | |
| 7,189,079 | B2 | 3/2007 | Noda et al. | |
| 7,232,315 | B2 * | 6/2007 | Uchida | H01R 12/721 |
| | | | | 439/492 |
| 7,383,632 | B2 | 6/2008 | Dittmann | |
| 7,445,462 | B2 * | 11/2008 | Kim | H05K 3/326 |
| | | | | 439/67 |
| 7,785,113 | B2 | 8/2010 | Mizoguchi | |
| 8,215,965 | B2 | 7/2012 | Mizoguchi | |
| 8,267,700 | B2 * | 9/2012 | Mizoguchi | H01R 12/613 |
| | | | | 439/67 |
| 2005/0237365 | A1 * | 10/2005 | Hiwada | B41J 2/14209 |
| | | | | 347/58 |
| 2005/0286240 | A1 * | 12/2005 | Sakamoto | B41J 2/14209 |
| | | | | 361/803 |
| 2010/0112833 | A1 * | 5/2010 | Jeon | H01R 12/523 |
| | | | | 439/78 |
| 2013/0270699 | A1 * | 10/2013 | Kuo | H01L 23/49816 |
| | | | | 257/738 |
| 2014/0004752 | A1 | 1/2014 | Sagayama et al. | |

\* cited by examiner

FLEXIBLE PRINTED CIRCUIT CONNECTOR AND CONNECTOR ASSEMBLY INCLUDING THE SAME

BACKGROUND

The subject matter herein relates generally to electrical connectors that include flexible printed circuits.

General trends in computing systems and devices include smaller sizes, increased functionalities, and faster computing speeds. Although these trends exist for larger communication systems, such as backplane or midplane communication systems, the demands have been specifically directed toward consumer devices, such as tablets, laptop computers, smartphones, digital cameras, and wearable technologies (e.g., activity trackers, smartwatches, and the like).

One known interconnection system includes a high density microfilm connector that is configured to be mounted onto a printed circuit. The microfilm connector has a reduced thickness compared to other connectors. The microfilm connector includes a flexible film having an array of contact pads. Each contact pad is electrically coupled to a corresponding conductive trace that extends through the flexible film. The flexible film includes an array of thru-holes in which each thru-hole is aligned with a corresponding contact pad. Each of the contact pads is formed from a plurality of flexible fingers that at least partially cover the corresponding thru-hole. More specifically, the flexible fingers extend radially inward toward a central axis of a corresponding thru-hole such that each finger partially covers the corresponding thru-hole.

The printed circuit of the known interconnection system has an array of conductive projections. When the microfilm connector is mounted onto the printed circuit, each of the conductive projections deflects the flexible fingers of a respective contact pad and advances into the corresponding thru-hole that is aligned with the respective contact pad. The flexible fingers are biased against the respective conductive projection and remain mechanically and electrically coupled to the conductive projection throughout operation of the interconnection system.

The above interconnection system, however, is manufactured using a variety of different manufacturing techniques that can be time consuming. Moreover, the effectiveness and/or the cost of implementing these techniques is based on a number of variables, such as a geometry of the microfilm connector, geometries of the flexible fingers, and/or geometry of the printed circuit. For some applications and/or system configurations, alternative methods for interconnecting two electrical components using a flexible printed circuit are desired.

Accordingly, there is a need for a flexible printed circuit connector that is capable of interconnecting two electrical components.

BRIEF DESCRIPTION

In an embodiment, a flexible printed circuit (FPC) connector is provided that includes a flex circuit having first and second side surfaces and a thickness extending between the first and second side surfaces. The flex circuit includes a plurality of stacked substrate layers. The FPC connector also includes a conductive pathway extending through the flex circuit and a substrate protrusion coupled to the second side surface and projecting a distance away from the second side surface. The substrate protrusion is formed from at least one dielectric layer. The FPC connector also includes a contact pad that is directly coupled to at least one of the substrate protrusion or the second side surface of the flex circuit. The contact pad is electrically coupled to the conductive pathway.

In some embodiments, the contact pad may be attached to the substrate protrusion or may have a proximate edge that is at most 0.25 mm away from the substrate protrusion. Optionally, the substrate protrusion may include a plurality of stacked dielectric layers. In some embodiments, the substrate protrusion may include a conductive layer that is interleaved between two of the dielectric layers. The conductive layer may not be directly coupled to the conductive pathway. Alternatively, the conductive layer may form a portion of the conductive pathway.

In an embodiment, a connector assembly is provided that includes a printed circuit having a circuit surface and a receiving cavity that opens to the circuit surface. The printed circuit also includes a conductive pathway having a contact pad that at least one of defines the receiving cavity or is located along the circuit surface. The connector assembly also includes a flexible printed circuit (FPC) connector having a flex circuit that has a plurality of stacked substrate layers and a side surface. The FPC connector has a conductive pathway that extends through the flex circuit and a substrate protrusion that is coupled to the side surface and projects a distance away from the side surface. The substrate protrusion includes at least one corresponding substrate layer. The FPC connector includes a contact pad that is directly coupled to at least one of the substrate protrusion or the second side surface of the flex circuit. The contact pad is electrically coupled to the conductive pathway of the FPC connector. The contact pad of the printed circuit is configured to electrically couple to the contact pad of the FPC connector when the substrate protrusion is received within the receiving cavity.

In an embodiment, a flexible printed circuit (FPC) connector is provided that includes a flex circuit having first and second circuit surfaces and a thickness extending between the first and second circuit surfaces. The flex circuit includes a plurality of stacked substrate layers. The FPC connector also includes a conductive pathway that extends through the flex circuit and a receiving cavity that is formed within the flex circuit and opens to the first circuit surface. The FPC connector also includes a contact pad that is electrically coupled to the conductive pathway, wherein the contact pad at least one of defines the receiving cavity or is located along the first circuit surface.

DETAILED DESCRIPTION

Embodiments set forth herein include apparatuses, such as flexible printed circuit (FPC) connectors and connector assemblies, that include at least one flex circuit. The FPC connector is configured to interconnect two or more electrical components. The electrical components may be any component that utilizes conductive pathways, such as a processor, another printed circuit, an electro-optical (EO) connector, and the like. If one of the electrical components is another printed circuit, the other printed circuit may be a rigid printed circuit board (PCB) or may be another flexible printed circuit. The FPC connector may have a relatively small thickness and therefore enable interconnections wherein space is minimized. In particular embodiments, the FPC connectors may be manufactured through printed circuit fabrication technologies.

Figure 1:
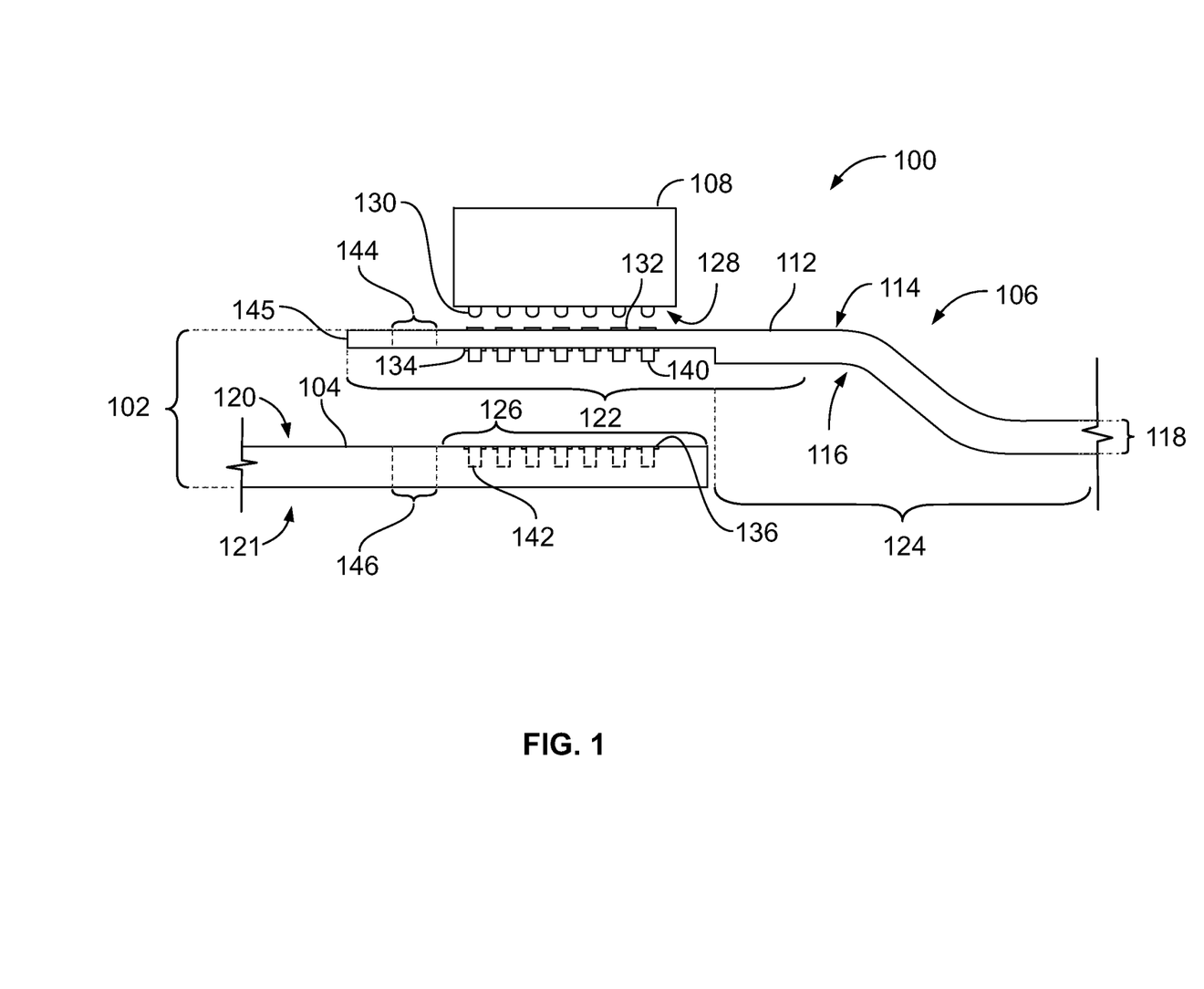
FIG. 1 is a schematic side view of a communication system formed in accordance with an embodiment.

FIG. 1 is a schematic side view of a portion of a communication system 100 formed in accordance with an embodiment. The communication system 100 includes a connector assembly 102 that has a printed circuit 104 and a flexible printed circuit (FPC) connector 106. At least a portion of the FPC connector 106 is configured to be interposed between the printed circuit 104 and an electronic device 108 and communicatively couple the printed circuit 104 and the electronic device 108. Alternatively, the electronic device 108 does not exist and the FPC connector 106 communicatively couples the printed circuit 104 to a remote system or device (not shown). In the illustrated embodiment, the electronic device 108 is a processor, such as an application specific integrated circuit (ASIC). However, the electronic device 108 may be other electrical devices in other embodiments, such as an electrical connector or an electro-optical (EO) device that converts electrical signals to optical signals and/or vice versa.

Each of the printed circuit 104 and/or the FPC connector 106 may be manufactured through a variety of fabrication technologies. For example, the printed circuit 104 and/or the FPC connector 106 may be manufactured through known printed circuit board (PCB) technologies. Each of the printed circuit 104 and/or the FPC connector 106 may be a laminate or sandwich structure that includes a plurality of stacked substrate layers. Each substrate layer may include, at least partially, an insulating dielectric material. By way of example, the substrate layers may include a dielectric material (e.g., flame-retardant epoxy-woven glass board (FR4), FR408, polyimide, polyimide glass, polyester, epoxy-aramid, metals, and the like); a bonding material (e.g., acrylic adhesive, modified epoxy, phenolic butyral, pressure-sensitive adhesive (PSA), preimpregnated material, and the like); a conductive material that is disposed, deposited, or etched in a predetermined manner; or a combination of the above. The conductive material may be copper (or a copper-alloy), cupro-nickel, silver epoxy, conductive polymer, and the like. It should be understood that substrate layers may include sub-layers of, for example, bonding material, conductive material, and/or dielectric material.

The FPC connector 106 includes a plurality of substrate layers that comprise a flexible material such that the substrate layers form a flex circuit 112 of the FPC connector 106. The flexible material may be, for example, polyimide. The flex circuit 112 has opposite first and second side surfaces 114, 116 and a thickness 118 extending therebetween. In some embodiments, the printed circuit 104 is a rigid PCB, such as a mother board or daughter card. In other embodiments, however, the printed circuit 104 may be similar to the FPC connector 106 and have a plurality of stacked substrate layers that form a flex circuit that is similar or identical to the flex circuit 112. The printed circuit 104 has first and second circuit surfaces 120, 121.

In some embodiments, designated sections of the FPC connector 106 (or the printed circuit 104) may include a rigid material. In other embodiments, one or two substrate layers may include a rigid material thereby causing the FPC connector 106 to be more rigid yet still flexible. For example, the FPC connector 106 may include a mating section 122 and a flex (or non-mating) section 124. The second side surface 116 along the mating section 122 is configured to interface with a mounting area 126 of the side surface 120 of the printed circuit 104. In the illustrated embodiment, the mating section 122 is also configured to interface with the electronic device 108. As such, the mating section 122 is configured to be interposed between the printed circuit 104 and the electronic device 108.

The components of the system 100 are communicatively coupled through conductive elements. For example, the electronic device 108 has a mounting side 128 that includes an array of electrical contacts 130. In the illustrated embodiment, the electrical contacts 130 are solder balls, but may be other types of electrical contacts, such as spring beams. The electrical contacts 130 are configured to be terminated to electrical contacts 132 along the first side surface 114 of the FPC connector 106. In the illustrated embodiment, the electrical contacts 132 are contact pads that are formed through, for example, an etching process when the FPC connector 106 is manufactured.

The electrical contacts 132 are electrically coupled to electrical contacts 134 along the second side surface 116 of the FPC connector 106. The electrical contacts 134 are contact pads in the illustrated embodiment. For example, the electrical contacts 132 may be electrically coupled to corresponding electrical contacts 134 through vias (not shown) (e.g., buried vias, plated thru-holes, and the like) and optional conductive traces (not shown). The electrical contacts 134 may have fixed positions relative to corresponding substrate protrusions 140. The substrate protrusions 140 may comprise one or more substrate layers that are manufactured through PCB technologies. In some embodiments, the substrate protrusions 140 are manufactured from the same substrate layers that are used to manufacture the substrate layers of the flex section 124. As shown, the electrical contacts 134 are positioned adjacent to substrate protrusions 140 along the second side surface 116. In other embodiments, the electrical contacts 134 may be positioned on the substrate protrusions 140 as described below.

The electrical contacts 134 are configured to be terminated to electrical contacts 136 along the side surface 120 of the printed circuit 104. The electrical contacts 136 may have fixed positions relative to corresponding receiving cavities 142. In the illustrated embodiment, the electrical contacts 136 are contact pads located along the side surface 120. In other embodiments, the electrical contacts 136 may be located within the receiving cavities 142.

The receiving cavities 142 are sized and shaped relative to the substrate protrusions 140 such that the receiving cavities 142 receive corresponding substrate protrusions 140. Because the electrical contacts 134 have fixed positions relative to corresponding substrate protrusions 140 and because the electrical contacts 136 have fixed positions relative to corresponding receiving cavities 142, the electrical contacts 134 may align with the corresponding electrical contacts 136 during a mounting or mating operation in which the mating section 122 is mounted onto the mounting area 126. Optionally, at least one of the second side surface 116 of the FPC connector 106 or the mounting area 126 of the printed circuit 104 may have a conductive material deposited therealong to facilitate electrically coupling the electrical contacts 134, 136. For example, the conductive material may include an anisotropic film or gel.

When the communication system 100 is fully constructed, the electrical contacts 130 of the electronic device 108 are terminated to the corresponding electrical contacts 132 of the FPC connector 106, and the electrical contacts 134 of the FPC connector 106 are terminated to the corresponding electrical contacts 136 of the printed circuit 104. Accordingly, the FPC connector 106 communicatively couples the electronic device 108 and the printed circuit 104. In some embodiments, the FPC connector 106 may also communicatively couple the electronic device 108 and the printed circuit 104 to a remote system or device (not shown). For example, one or more conductive traces (not shown) may extend through the non-mating section 124 of the FPC connector 106 to the remote system or device. In alternative embodiments, the electronic device 108 does not exist and the mating section 122 only engages the printed circuit 104 to communicatively couple the printed circuit 104 to the remote system or device.

Optionally, the FPC connector 106 and/or the printed circuit 104 may include one or more alignment holes. For example, the FPC connector 106 includes an alignment hole 144 that is located proximate to a leading edge 145 of the flex circuit 112. The printed circuit 104 may include an alignment hole 146. In the illustrated embodiment, the alignment hole 144 extends entirely through the flex circuit 112, and the alignment hole 146 extends entirely through the printed circuit 104. In other embodiments, however, one or both of the alignment holes 144, 146 may extend only partially through the flex circuit 112 and the printed circuit 104, respectively. Although only one alignment hole is shown through each of the FPC connector 106 and the printed circuit 104, it should be understood that additional alignment holes may be provided through the FPC connector 106 and the printed circuit 104 in other embodiments.

The alignment holes 144, 146 may be used for gross alignment of the FPC connector 106 and the printed circuit 104 during the mounting operation. For instance, the alignment holes 144, 146 may be configured to receive a rivet, screw, or other hardware (not shown) for securing the FPC connector 106 and the printed circuit 104 to each other. When the FPC connector 106 and the printed circuit 104 are secured to each other side-by-side, the communication system 100 may be subjected to a curing operation. For example, an anisotropic conductive film or gel (described below) may be permitted to cure while the FPC connector 106 and the printed circuit 104 are secured to each other. It is noted that the alignment holes 144, 146 are well known and that other mechanisms for aligning the FPC connector 104 and the printed circuit 106 can be used.

Figure 2:
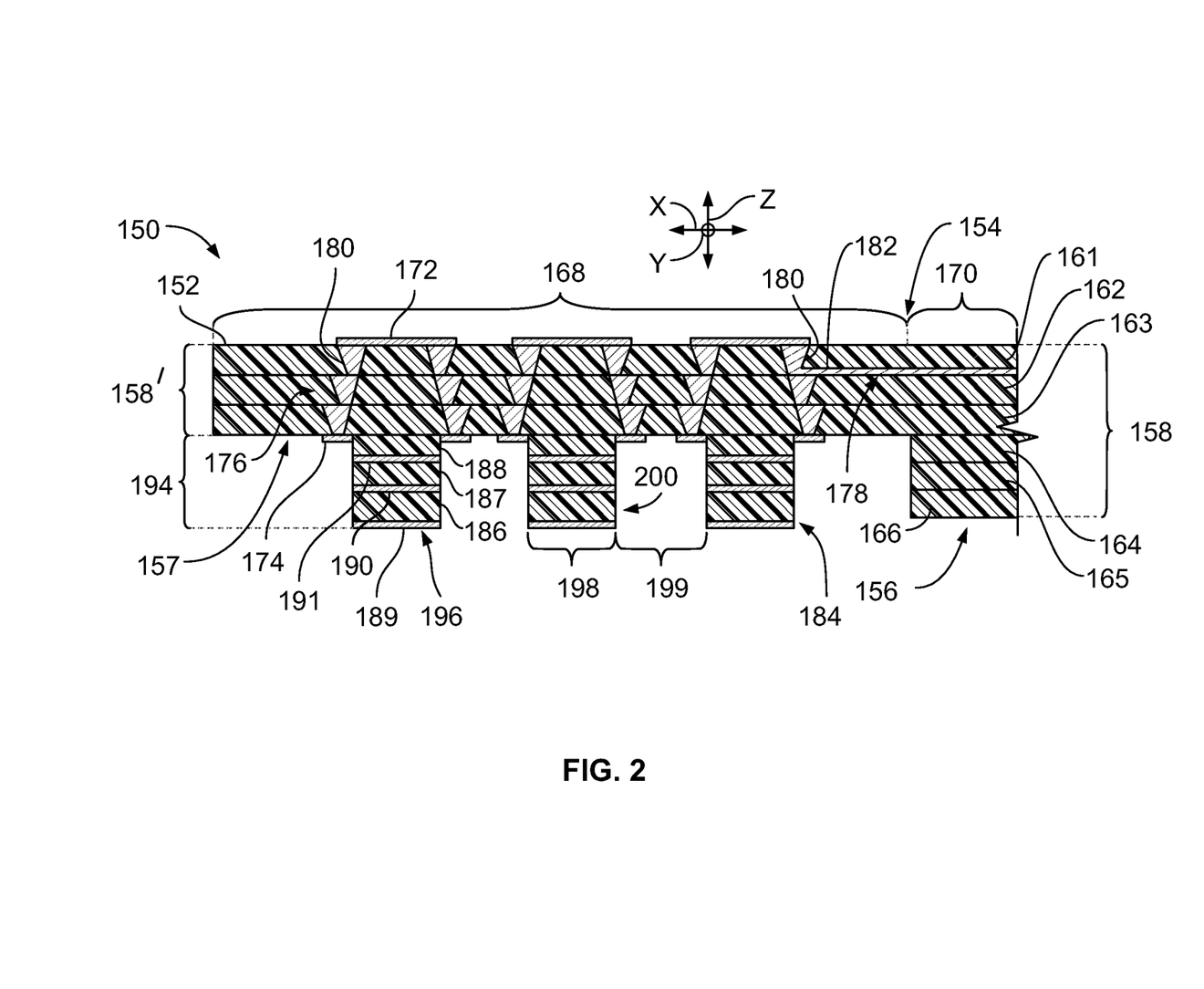
FIG. 2 is a side cross-section of a flexible printed circuit (FPC) connector formed in accordance with an embodiment that may be used with the communication system of FIG. 1.

FIG. 2 is a side cross-section of an FPC connector 150 formed in accordance with an embodiment. For reference, the FPC connector 150 is oriented with respect to an X-axis, a Y-axis, and a Z-axis that are mutually perpendicular with one another. The FPC connector 150 may be similar or identical to the FPC connector 106 (FIG. 1). For example, the FPC connector 150 includes a flex circuit 152 having first and second side surfaces 154, 156 and a thickness 158 extending between the first and second side surfaces 154, 156.

The flex circuit 152 includes a plurality of stacked substrate layers 161-166. In the illustrated embodiment, the substrate layers 161-166 include flexible dielectric layers, such as polyimide. However, it is contemplated that the flex circuit 152 may include one or more sections having a rigid material. For example, FIG. 2 shows a mating section 168 of the flex circuit 152 and only a portion of a flex (or non-mating) section 170. In alternative embodiments, the mating section 168 may include an added rigid layer, which may provide structural integrity to the mating section 168. The substrate layers 161-166 extend generally parallel to an XY plane in FIG. 2. However, because the substrate layers 161-166 may comprise flexible material, the substrate layers 161-166 are not required to extend parallel to the XY plane during use.

In the illustrated embodiment, the FPC connector 150 includes an array of contact pads 172 positioned along the first side surface 154 and an array of contact pads 174 positioned along the second side surface 156. More specifically, the contact pads 174 are attached to a base surface 157, which is the portion of the second side surface 156 that extends along the mating section 168. In the illustrated embodiment, each of the contact pads 172 is substantially aligned with a corresponding contact pad 174 along the Z-axis. In other embodiments, the contact pads 172 are not aligned with the contact pads 174 along the Z-axis. For example, the flex circuit 152 may include one or more conductive traces that interconnect a contact pad 172 to a corresponding contact pad 174 in which the contact pads 172, 174 have different X and/or Y positions with respect to one another.

The FPC connector 150 includes a plurality of conductive pathways 176, 178 that extend through the flex circuit 152. Each conductive pathway 176, 178 may include one or more interconnected conductive elements. For example, the conductive pathways 176 includes a series of interconnected vias 180. The conductive pathways 176 interconnect (e.g., electrically couple) a contact pad 172 to a corresponding contact pad 176. The conductive pathway 178 includes a conductive trace 182 and one of the series of the vias 180. The conductive trace 182 may extend through the flex section 170 to a remote system or device (not shown).

Also shown in FIG. 2, the FPC connector 150 may include a plurality of substrate protrusions 184 that extend in a direction parallel to the Z-axis. Each of the substrate protrusions 184 has a diameter 198, which may represent the protrusion's greatest cross-sectional dimension within the XY plane. Each of the substrate protrusions 184 is coupled to the base surface 157 and projects a distance 194 away from the base surface 157. As described below, each of the contact pads 174 may surround a corresponding substrate protrusion 184.

Each of the substrate protrusions 184 is formed from a plurality of dielectric layers 186, 187, and 188 and a plurality of conductive layers 189, 190, and 191. The conductive layer 189 includes a distal surface 196 of the substrate protrusion 184 that is furthest from the base surface 157. The conductive layer 190 is disposed between the dielectric layers 186, 187, and the conductive layer 191 is disposed between the dielectric layers 187, 188. In the illustrated embodiment, the conductive layers 189-191 do not form a part of a conductive pathway for communicating data signals or electrical power. In such embodiments, the conductive layers 189-191 may increase or enhance structural integrity of the substrate protrusion 184. More specifically, the conductive layers 189-191 may increase a rigidity or durability of the substrate protrusion 184. In other embodiments, such as those described below, one or more of the conductive layers 189-191 may form a part of a conductive pathway. For example, the conductive layer 189 may form a contact pad that is configured to engage a corresponding contact pad of a printed circuit.

In some embodiments, the dielectric layers 186, 187, and 188 correspond to shaped portions of other layers, such as the substrate layers 166, 165, and 164, respectively. For example, the substrate protrusions 184 are separated by gaps or spaces 199. The gaps or spaces 199 may be provided by a subtractive process in which portions of a printed circuit are removed. For example, the subtractive process may include milling and/or etching material from the flex circuit 152 or, more specifically, the substrate layers 164-166. As such, the substrate protrusions 184 may be defined by milled or etched edges 200. In other embodiments, the dielectric layers 186-188 may be remnants of layers that do not form part of the FPC connector 150. For example, in alternative embodiments, the substrate layers 164-166 may be completely removed (e.g., through etching or milling), except for the portions that form the dielectric layers 186-188 (or the substrate protrusions 184).

In some cases, the milled and/or etched edges 200 may be identified upon close inspection of the substrate protrusions 184. For example, a scanning electron microscope (SEM) or other imaging system may capture an image of the edges 200 of the substrate protrusions 184. The edges 200 may have qualities or characteristics that are indicative of surfaces that are milled or surfaces that are etched. Likewise, an FPC connector may be cut into two or more pieces and the pieces may be examined to determine that the dielectric layers of the substrate protrusions are formed from respective substrate layers of a remainder of the flex circuit or from layers that have identical compositions of the substrate layers. For example, in the illustrated embodiment, an SEM image may confirm that the dielectric layers 186, 187, 188 are portions of the substrate layers 166, 165, 164, respectively, or portions of layers that have the same compositions of the substrate layers 166, 165, 164.

It is also contemplated that the substrate protrusions 184 may be provided through one or more additive processes. For example, one or more processes for fabricating the FPC connector 150 may include additive techniques in which material is added to the base surface 157. Such processes may include chemical vapor deposition (CVD), low pressure CVD (LPCVD), physical vapor deposition (PVD), plasma-enhanced CVD (PECVD), atomic layer deposition (ALD), spin-on techniques, sputtering, thermal oxidation, three-dimensional (3D) printing, conductive ink printing, and epitaxy. The above list is not intended to be limiting and other additive techniques or processes may be used.

The mating section 168 may have a reduced thickness 158' that corresponds to, for example, a thickness of the substrate layers 161-163. These substrate layers 161-163 did not have corresponding material removed through the subtractive process that formed the gaps 199. In some embodiments, a sum of the distance 194 and the reduced thickness 158' may be essentially equal to the thickness 158 of the flex circuit 152 prior to undergoing any subtractive process. More specifically, any difference between the sum and the thickness 158 may be caused by one or more conductive layers, such as the conductive layer 189. In various embodiments, the thickness 158 may be about 2.0 millimeters (mm), about 1.5 mm, 1.0 mm, or less. In particular embodiments, the thickness 158 may be about 0.7 mm, 0.5 mm, or less.

Figure 3:
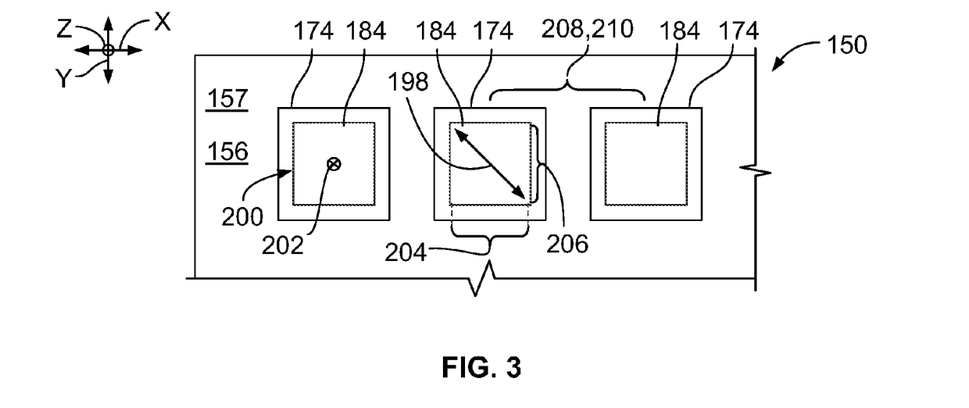
FIG. 3 is a bottom plan view of the FPC connector of FIG. 2.

FIG. 3 is a bottom plan view of the FPC connector 150 illustrating a portion of the base surface 157 in greater detail. In particular, FIG. 3 shows a plurality of substrate protrusions 184 and the corresponding contact pads 174 that surround the substrate protrusions 184. The contact pads 174 are directly coupled to at least one of the corresponding substrate protrusions 184 or the base surface 157 (or the second side surface 156). Each of the substrate protrusions 184 projects away from the base surface 157 (or the second side surface 156) in a direction along a protrusion axis 202. The protrusion axis 202 extends parallel to the Z-axis. In the illustrated embodiment, the substrate protrusions 184 have a rectangular contour when viewed along the protrusion axes 202. For example, each of the substrate protrusions 184 may have a first dimension 204 taken along the X-axis and a second dimension 206 taken along the Y-axis. The first and second dimensions 204, 206 may be equal or not equal. The diameter 198 is a diagonal that extends between two corners of the substrate protrusion 184. In other embodiments, the substrate protrusions 184 may have different shapes. For example, the substrate protrusions 184 may have a circular or oval-shaped cross-section when viewed along the corresponding protrusion axes 202.

In the illustrated embodiment, the contact pad 174 has a similar but larger shape as the substrate protrusion 184 (e.g., rectangular or square-shaped). In other embodiments, however, the contact pad 174 may have a shape that is not similar to the shape of the substrate protrusion 184. As shown, the contact pad 174 engages the edge 200 of the substrate protrusion 184. In other embodiments, however, the contact pad 174 may be positioned proximate to the corresponding substrate protrusion 184 such that a gap exists between the edge 200 and the contact pad 174. In the illustrated embodiment, the contact pad 174 surrounds or borders the corresponding substrate protrusion 184. In other embodiments, the contact pad 174 may not completely surround the corresponding substrate protrusion 184.

The substrate protrusions 184 may have a designated pitch (or center-to-center spacing) 208. In various embodiments, the designated pitch may be about 2.0 millimeters (mm), about 1.0 mm, 0.7 mm, 0.5 mm, or less. In more particular embodiments, the designated pitch may be about 0.4 mm, 0.3 mm, or less. In FIG. 3, the designated pitch is measured along the X-axis. The substrate protrusions 184 may have a similar or identical pitch along the Y-axis. The contact pads 174 may have a designated pitch 210 that is similar or identical to the pitch 208. In other embodiments, the contact pads 174 have a different pitch.

Figure 4:
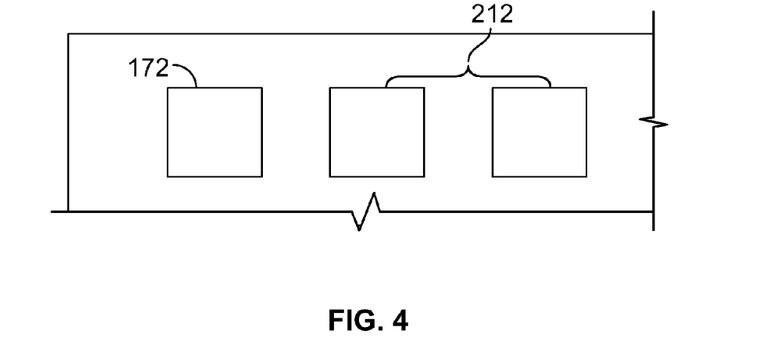
FIG. 4 is a top plan view of the FPC connector of FIG. 2.

FIG. 4 is a top plan view of the FPC connector 150. The contact pads 172 may have any designated shape. For example, the contact pads 172 have a rectangular or square shape in FIG. 4. In other embodiments, the contact pads 172 may have another shape, such as circular or oval. The contact pads 172 may have a designated pitch (or center-to-center spacing) 212. In various embodiments, the designated pitch 212 may be about 2.0 millimeters (mm) 1.0 mm, 0.7 mm, 0.5 mm, or less. In more particular embodiments, the designated pitch 212 may be about 0.4 mm, 0.3 mm, or less. Although the designated pitch 212 may be equal to the designated pitch 210 (FIG. 3), the pitches 210, 212 may be different. For example, the pitch 212 may be less than the pitch 210.

Figure 5:
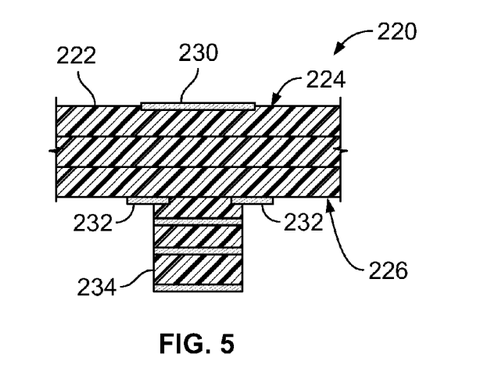
FIG. 5 is an isolated cross-section of a FPC connector formed in accordance with an embodiment.
Figure 6:
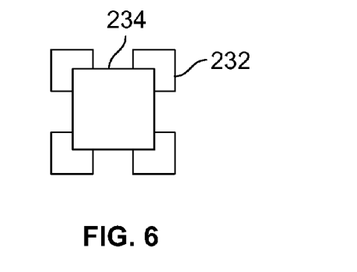
FIG. 6 is a bottom plan view of a portion of the FPC connector of FIG. 5.

FIGS. 5-10 illustrate different examples of substrate protrusions and corresponding contact pads associated with the substrate protrusions. The substrate protrusions and the contact pads may be similar to the other substrate protrusions and contact pads described herein. For example, FIG. 5 is an isolated cross-section of an FPC connector 220 formed in accordance with an embodiment. The FPC connector 220 includes a flex circuit 222 having first and second side surfaces 224, 226 that face in opposite directions. The flex circuit 222 has a contact pad 230 positioned along the first side surface 224 and a plurality of discrete contact pads 232 positioned along the second side surface 226. The contact pads 232 are positioned around a substrate protrusion 234 that projects away from the second side surface 226. The contact pads 232 and the contact pad 230 may be part of a common conductive pathway through the flex circuit 222. Alternatively, each of the contacts pads 230, 232 is part of a different conductive pathway through the flex circuit 222. FIG. 6 is a bottom plan view of the FPC connector 220. As shown, the single substrate protrusion 234 is surrounded by four (4) discrete contact pads 232.

Figure 7:
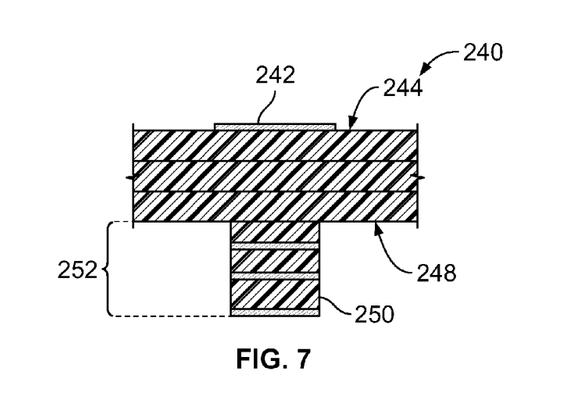
FIG. 7 is an isolated cross-section of a portion of the FPC connector formed in accordance with an embodiment.
Figure 8:
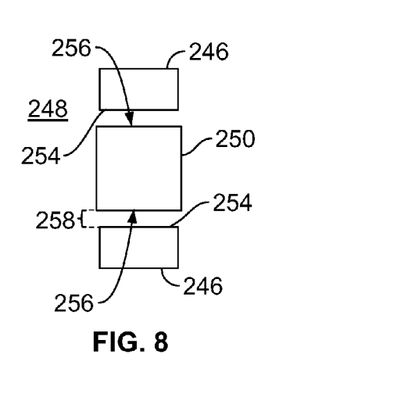
FIG. 8 is a bottom plan view of the FPC connector of FIG. 7.

FIG. 7 is an isolated cross-section of a portion of an FPC connector 240 formed in accordance with an embodiment, and FIG. 8 is a bottom plan view of the FPC connector 240. The FPC connector 240 includes a contact pad 242 (FIG. 7) along a first side surface 244 (FIG. 7), and a plurality of contact pads 246 (FIG. 8) along a second side surface 248. Each of the contact pads 246 may be electrically coupled to a corresponding contact pad 242. The FPC connector 240 also includes a substrate protrusion 250 that projects a distance 252 (FIG. 7) away from the second side surface 248.

As shown in FIG. 8, the contact pads 246 have proximate edges 254 that are spaced apart from a corresponding edge 256 of the substrate protrusion 250. Embodiments set forth herein include contact pads that engage substrate protrusions and contact pads that are spaced apart from one or more substrate protrusions. In the illustrated embodiment of FIG. 8, the proximate edges 254 are separated from the corresponding edges 256 by corresponding gaps 258. The gap 256 may be, for example, less than 0.25 mm or, more specifically, less than 0.15 mm.

Figure 9:
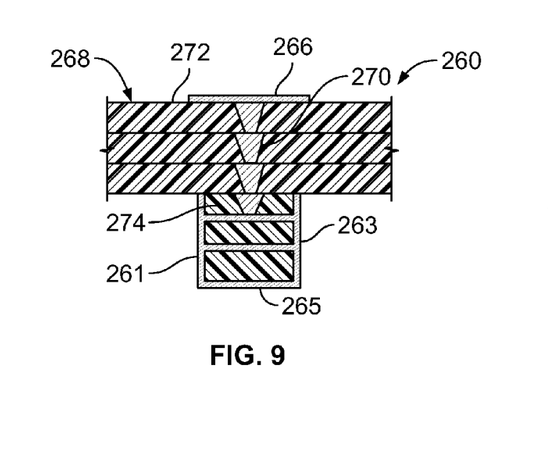
FIG. 9 is an isolated cross-section of a portion of the FPC connector formed in accordance with an embodiment.
Figure 10:
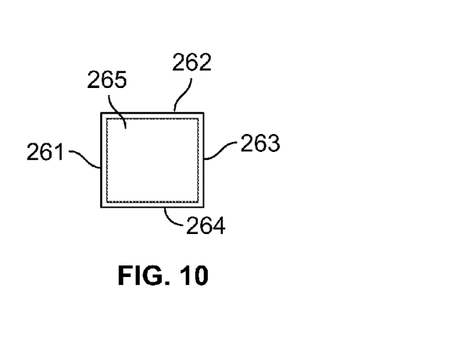
FIG. 10 is a bottom plan view of the FPC connector of FIG. 9.

FIG. 9 is an isolated cross-section of a portion of an FPC connector 260 formed in accordance with an embodiment, and FIG. 10 is a bottom plan view of the FPC connector 260. In the embodiment of FIGS. 9 and 10, the FPC connector 260 includes a plurality of contact pads 261-265 that are coupled to a substrate protrusion 274. The contact pads 261-265 may form parts of a common conductive pathway that electrically couples the contact pads 261-265 to a contact pad 266 positioned along an opposite side surface 268. The conductive pathway may include, for example, a series of vias 270 that are buried within a flex circuit 272 of the FPC connector 260. In some embodiments, the contact pads 261-265 engage each other and, as such, may be considered as a single electrical contact. The contact pads 261-265 may be provided through a plating process after the substrate protrusion 274 is provided through a subtractive process. In other embodiments, the FPC connector 260 may include fewer contact pads. For example, the FPC connector 260 may include only the contact pad 265 or only the contact pads 261 and 263. In such embodiments in which the contact pads are discrete, each contact pad may form part of a different conductive pathway.

Figure 11:
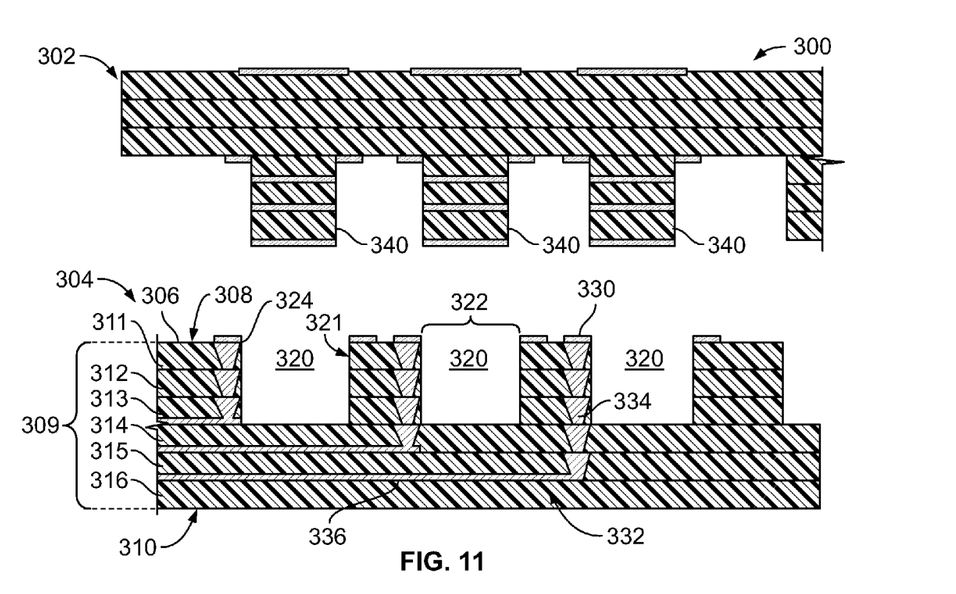
FIG. 11 is a side view of a connector assembly formed in accordance with an embodiment prior to a mounting operation.

FIG. 11 is a side view of a connector assembly 300 formed in accordance with an embodiment. The connector assembly 300 includes an FPC connector 302 that may be similar or identical to the other FPC connectors described herein, such as the FPC connector 106 (FIG. 1). The connector assembly 300 also includes a printed circuit 304 that is configured to engage the FPC connector 106. In some embodiments, the printed circuit 304 is a rigid PCB. In other embodiments, however, the printed circuit 304 is also an FPC connector. In such embodiments, the FPC connector 302 may be referred to as the first FPC connector, and the FPC connector 304 may be referred to as the second FPC connector.

For example, the printed circuit 304 may include a flex circuit 306 having first and second circuit surfaces 308, 310 and a thickness 309 extending between the first and second circuit surfaces 308, 310. The first and second circuit surfaces 308, 310 may be similar to the side surfaces described herein, but are labeled as "circuit surfaces" to distinguish from the side surfaces. The flex circuit 306 may include a plurality of stacked substrate layers 311-316. The printed circuit 304 may be manufactured in a similar manner as described above with respect to the FPC connector 106.

The flex circuit 306 is formed to include a plurality of receiving cavities 320 that are sized and shaped to receive corresponding substrate protrusions 340 of the FPC connector 302. Each of the receiving cavities 320 opens to the first circuit surface 308. The receiving cavities 320 may have corresponding openings 322 that are defined by respective cavity corner or edges 324. Each corner 324 may be defined by the first circuit surface 308 and an inner cavity surface 321 that defines the receiving cavity 320.

Also shown in FIG. 11, the flex circuit 306 includes a plurality of contact pads 330. In an exemplary embodiment, each of the contact pads 330 is a ring that extends along a respective cavity edge 324 thereby surrounding a respective opening 322. The printed circuit 304 may include one or more conductive pathways 332 that extend through the flex circuit 306. For example, each conductive pathway 332 may include a corresponding contact pad 330, one or more corresponding vias 334, and one or more conductive traces 336.

Figure 12:
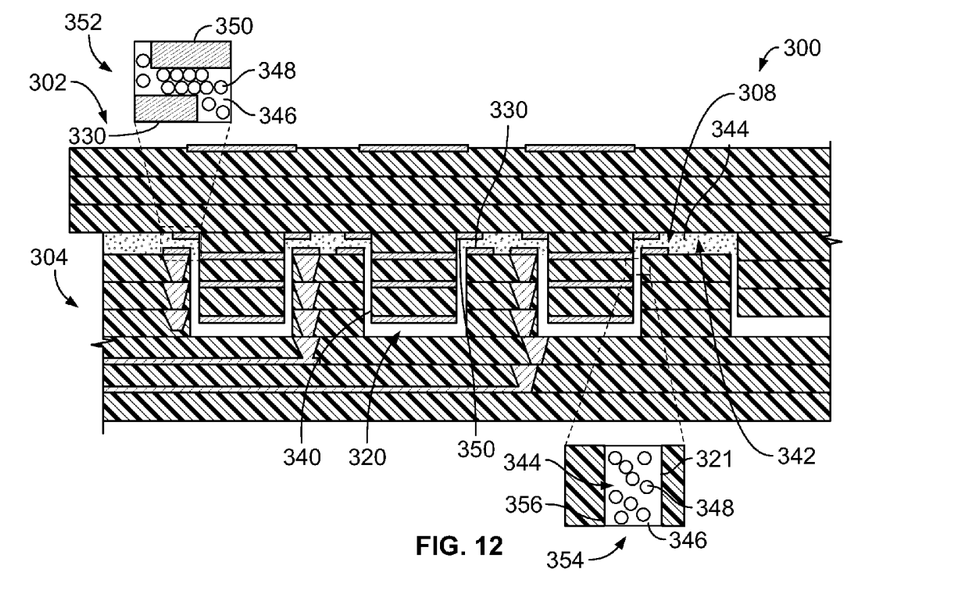
FIG. 12 is a side view of the connector assembly of FIG. 11 after the mounting operation.

FIG. 12 is a side view of the connector assembly 300 after the FPC connector 302 has been coupled to the printed circuit 304. Prior to the mating or mounting operation, a conductive material 344 may be applied to a second side surface 342 of the FPC connector 302 or the first circuit surface 308 of the printed circuit 304. The conductive material 344 may be an anisotropic conductive film or gel. As shown in the enlarged portions of FIG. 12, the conductive material 344 may include an adhesive material 346 having conductive particles 348 suspended and/or distributed therein.

During the mounting operation, each of the substrate protrusions 340 is advanced into a corresponding receiving cavity 320. The contact pads 330 may interface with corresponding contact pads 350 of the FPC connector 302. More specifically, the contact pads 330 may be electrically coupled to the corresponding contact pads 350 through the conductive material 344. FIG. 12 shows an enlarged view of an interface 352 defined between a contact pad 330 and a contact pad 350. As shown, a conductive bridge is formed through the conductive particles 348 of the conductive material. FIG. 12 also shows an enlarged view of an interface 354 between the inner cavity surface 321 and an edge 356 of the substrate protrusion 340. Due to the separation between the inner cavity surface 321 and the edge 356, a conductive bridge is not formed by the conductive particles.

In alternative embodiments, the conductive material 344 is not applied. In such embodiments, the corresponding contact pads may directly engage each other.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The patentable scope should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112(f), unless and until such claim limitations expressly use the phrase "means for" followed by a statement of function void of further structure.

What is claimed is:

1. A flexible printed circuit (FPC) connector comprising:
   a flex circuit having first and second side surfaces and a thickness extending between the first and second side surfaces, the flex circuit comprising a plurality of stacked printed-circuit substrate layers, the printed-circuit substrate layers including a base layer and multiple protrusion layers that are stacked along a Z-axis and that are bonded to one another along respective interfaces, the base layer extending along the second side surface, wherein a substrate protrusion is coupled to the base layer and projects a distance away from the second side surface, the substrate protrusion including the protrusion layers, wherein the interfaces between the base layer and the substrate protrusion and between the protrusion layers of the substrate protrusion extend parallel to one another and a XY-plane for an entirety of the substrate protrusion, the XY-plane being perpendicular to the Z-axis;
   a conductive pathway extending through the flex circuit; and
   a contact pad directly coupled to at least one of the substrate protrusion or the second side surface of the flex circuit, the contact pad being electrically coupled to the conductive pathway.

2. The FPC connector of claim 1, wherein the contact pad is directly attached to the second side surface and is directly attached to the substrate protrusion or has a proximate edge that is at most 0.25 mm away from the substrate protrusion, the protrusion layers having multiple dielectric layers stacked with respect to one another and a conductive layer disposed between two of the dielectric layers.

3. The FPC connector of claim 1, wherein the contact pad is directly attached to the second side surface and has a proximate edge that is at most 0.25 mm away from the substrate protrusion.

4. A connector assembly comprising:
   a printed circuit having a circuit surface and a receiving cavity that opens to the circuit surface, the printed circuit also including a conductive pathway having a contact pad that at least one of defines the receiving cavity or is located along the circuit surface; and
   the FPC connector of claim 1;
   wherein the contact pad of the printed circuit is configured to electrically couple to the contact pad of the FPC connector when the substrate protrusion is received within the receiving cavity.

5. The connector assembly of claim 4, wherein the contact pad of the FPC connector is attached to the substrate protrusion, the protrusion layers including multiple dielectric layers stacked with respect to one another.

6. The connector assembly of claim 4, wherein the contact pad of the FPC connector is attached to the base surface and has a proximate edge that is at most 0.25 mm away from the substrate protrusion, the protrusion layers including multiple dielectric layers stacked with respect to one another.

7. The connector assembly of claim 4, wherein the protrusion layers includes multiple dielectric layers and a conductive layer disposed between two of the dielectric layers, wherein the conductive layer is not directly coupled to the conductive pathway.

8. The connector assembly of claim 4, wherein the protrusion layers include multiple dielectric layers and a conductive layer disposed between two of the dielectric layers, wherein the conductive layer forms a portion of the conductive pathway.

9. The connector assembly of claim 4, wherein a conductive film or gel is disposed along at least one of the contact pad of the printed circuit or the contact pad of the FPC connector.

10. The connector assembly of claim 4, wherein the contact pad of the FPC connector is one of an array of similar contact pads of the FPC connector, and the contact pad of the printed circuit is one of an array of similar contact pads of the printed circuit, the array of contact pads of the printed circuit being configured to electrically couple to the array of contact pads of the FPC connector.

11. The connector assembly of claim 4, wherein the FPC connector is a first FPC connector and the printed circuit constitutes a second FPC connector having a corresponding flex circuit that includes a plurality of stacked printed-circuit substrate layers and the circuit surface, the receiving cavity formed within the plurality of stacked printed-circuit substrate layers of the second FPC connector.

12. The FPC connector of claim 1, wherein the exterior surface of the substrate protrusion is a milled or etched exterior surface, the protrusion layers being discrete substrate layers that are stacked over one another and secured together.

13. The FPC connector of claim 1, wherein the printed-circuit substrate layers include a substrate layer that is bonded to the base layer along an interface, the base layer being positioned between the substrate layer and the protrusion layers, wherein a portion of the interface between the base layer and the substrate layer aligns with the substrate protrusion along the Z-axis and is parallel to the XY-plane for an entirety of the substrate protrusion.

14. A flexible printed circuit (FPC) connector comprising:
a flex circuit having first and second side surfaces and a thickness extending between the first and second side surfaces, the flex circuit comprising a plurality of stacked substrate layers;
a conductive pathway extending through the flex circuit;
a substrate protrusion coupled to the second side surface and projecting a distance away from the second side surface, the substrate protrusion being formed from multiple dielectric layers and a conductive layer disposed between two of the dielectric layers, the two dielectric layers and the conductive layer being parallel to one another and a XY plane for an entirety of the substrate protrusion, wherein the two dielectric layers and the conductive layer have respective layer edges that shape the substrate protrusion; and
a contact pad directly coupled to at least one of the substrate protrusion or the second side surface of the flex circuit, the contact pad being electrically coupled to the conductive pathway.

15. The FPC connector of claim 14, wherein the conductive layer forms a portion of the conductive pathway.

16. The FPC connector of claim 14, wherein the FPC connector includes a mating section and a non-mating section, at least one of the substrate layers extending along the mating section and the non-mating section, the at least one substrate layer being shaped along the mating section to include an empty space that surrounds the substrate protrusion.

17. The FPC connector of claim 14, further comprising a contact pad along the first side surface, the conductive pathway electrically coupling the contact pads along the first and second side surfaces, the conductive pathway including a plurality of interconnected vias that are buried within the flex circuit.

18. The FPC connector of claim 14, wherein the contact pad is directly attached to the second side surface and is directly attached to the substrate protrusion or has a proximate edge that is at most 0.25 mm away from the substrate protrusion.

19. A flexible printed circuit (FPC) connector comprising:
a flex circuit having first and second side surfaces and a thickness extending between the first and second side surfaces, the flex circuit comprising a plurality of stacked printed-circuit substrate layers, wherein a portion of at least one of the printed-circuit substrate layers is removed to form a substrate protrusion that is coupled to the second side surface and projects a distance away from the second side surface;
a conductive pathway extending through the flex circuit; and
a contact pad directly coupled to at least one of the substrate protrusion or the second side surface of the flex circuit, the contact pad being electrically coupled to the conductive pathway, wherein the conductive layer is not directly coupled to the conductive pathway.

20. A flexible printed circuit (FPC) connector comprising:
a flex circuit having first and second side surfaces and a thickness extending between the first and second side surfaces, the flex circuit comprising a plurality of stacked printed-circuit substrate layers, wherein a portion of at least one of the printed-circuit substrate layers is removed to form a substrate protrusion that is coupled to the second side surface and projects a distance away from the second side surface;
a conductive pathway extending through the flex circuit; and
a contact pad directly coupled to at least one of the substrate protrusion or the second side surface of the flex circuit, the contact pad being electrically coupled to the conductive pathway, wherein the contact pad is directly coupled to the substrate protrusion along the second side surface, the FPC connector further comprising a contact pad along the first side surface, the conductive pathway electrically coupling the contact pads along the first and second side surfaces, the conductive pathway including a plurality of interconnected vias that are buried within the flex circuit, wherein one of the vias directly couples to the contact pad along the second side surface.

* * * * *